US006784686B2

(12) United States Patent
Nishida et al.

(10) Patent No.: US 6,784,686 B2
(45) Date of Patent: Aug. 31, 2004

(54) SEMICONDUCTOR TESTING DEVICE

(75) Inventors: Hiroki Nishida, Tokyo (JP); Yoshihiro Nagura, Tokyo (JP)

(73) Assignee: Renesas Technology Corp., Chiyoda-Ku (JP)

( * ) Notice: Subject to any disclaimer, the term of this patent is extended or adjusted under 35 U.S.C. 154(b) by 0 days.

(21) Appl. No.: 10/430,271

(22) Filed: May 7, 2003

(65) Prior Publication Data
US 2004/0103357 A1 May 27, 2004

(30) Foreign Application Priority Data
Nov. 8, 2002 (JP) ........................................ 2002-325129

(51) Int. Cl.[7] .............................................. G01R 31/02
(52) U.S. Cl. .................... 324/765; 324/763; 324/158.1; 714/733
(58) Field of Search ...................... 324/158.1, 754–765; 714/733, 734, 724, 726; 326/16, 40, 38; 702/117, 108, 121

(56) References Cited

U.S. PATENT DOCUMENTS

| 5,931,629 A | * | 8/1999 | Rodier ........................ 414/413 |
| 6,651,023 B2 | * | 11/2003 | Mori et al. ................. 702/117 |
| 6,714,888 B2 | * | 3/2004 | Mori et al. ................. 702/120 |

FOREIGN PATENT DOCUMENTS

JP          8-129487          5/1996

* cited by examiner

Primary Examiner—Ernest Karlsen
Assistant Examiner—Jimmy Nguyen
(74) Attorney, Agent, or Firm—Burns, Doane, Swecker & Mathis, L.L.P.

(57) ABSTRACT

When a test pattern is output that shows that a program has shifted to a subroutine, a subroutine stay time measuring circuit starts counting a count value that shows a program stay time in the subroutine, and outputs return instruction data when the count value reaches a predetermined value. A sequence control circuit controls a program counter value so that the program returns to a call originating routine when the sequence control circuit receives the return instruction data and also when a test pattern that shows that the program returns from the subroutine to the call originating routine is output.

20 Claims, 9 Drawing Sheets

FIG.9
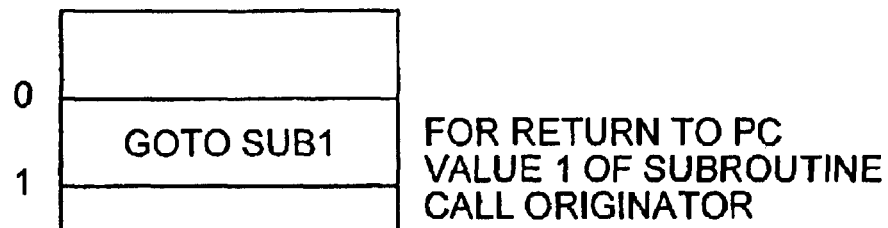
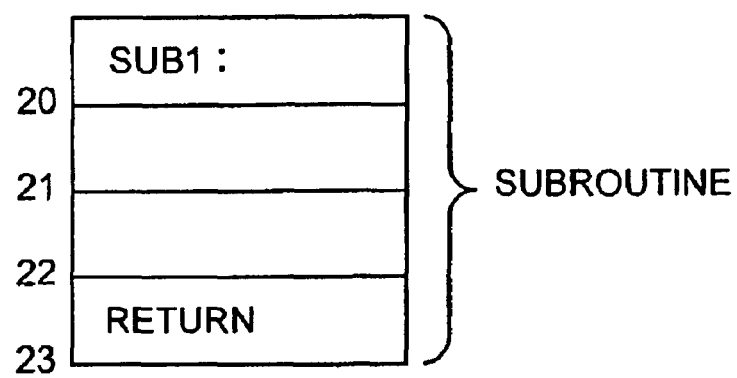

SEMICONDUCTOR TESTING DEVICE

BACKGROUND OF THE INVENTION

1) Field of the Invention

The present invention relates to a semiconductor testing device that tests a semiconductor device based on a test pattern.

2) Description of the Related Art

Conventionally, there is known a semiconductor testing device incorporated in chip (hereinafter "semiconductor testing device") that tests a semiconductor device disposed in the same chip by using a test pattern. Specifically, this semiconductor testing device includes a pattern generator that generates a test pattern and the semiconductor device is tested based on the test pattern generated by this pattern generator. Such a semiconductor testing device is disclosed in, for example, Japanese Patent Application Laid-open No. 8-129487 (hereinafter "patent literature 1"), on page 5, FIG. 1.

However, the conventional semiconductor testing device has the following problems.

(1) This semiconductor testing device cannot generate a test pattern that includes a subroutine, which complicates the test pattern in the end. In other words, when a jump or a loop is used in place of a subroutine, as it is not possible to use the subroutine, the test pattern itself becomes too long and complex even when a test pattern for repeating the same processing is prepared.

(2) This semiconductor testing device cannot use a subroutine and does not have a counter that measures a lapse time. Therefore, a test pattern becomes complex. When a volatile memory such as a dynamic RAM (Random Access Memory) is used in this semiconductor testing device incorporated in chip, it is necessary to rewrite data (auto refresh) at a predetermined time interval in order to avoid loss of data. However, as the semiconductor testing device cannot use a subroutine and does not have a counter that measures a lapse time, it is not possible to carry out auto refresh. Consequently, it is necessary to prepare a complex test pattern.

(3) At the time of carrying out a test by using a certain test pattern, the semiconductor testing device determines a test time (T) based on a product of a test period (t) of this test pattern and a number of times of repetition (n), that is (n×t). The semiconductor testing device cannot independently change the test period (t) or the number of times of repetition (n) by keeping the test time (T) constant. Consequently, it is complex to prepare a test pattern, change a test specification, and analyze the device.

(4) Further, the test period (t) is a function of a device operation cycle (τ). Therefore, it is not possible to independently change the device operation cycle (τ) by keeping the test time (T) constant. Consequently, it is not possible to carry out a performance test of the device.

Because of such problems, it is extremely important to facilitate the preparation of a test pattern, the changing of a test specification, and the device analysis respectively in a short time, by making it possible to carry out auto refresh and independent changing of a device operation cycle and a device test time. In the patent literature 1, there is disclosed a program sequence control circuit that carries out a nesting of a subroutine with a view to increasing the speed of the circuit and simplifying the circuit, by changing a general purpose memory to a shift register. The patent literature 1 has an object of increasing the speed of the program sequence control circuit and simplifying the circuit and does not have an object of facilitating the preparation of a test pattern. Therefore, it is not possible to solve the above problems.

SUMMARY OF THE INVENTION

It is an object of this invention to at least solve the problems in the conventional technology.

The semiconductor testing device according to one aspect of the present invention is incorporated in chip in which a semiconductor device that is a target for test is incorporated. The semiconductor testing device comprises a pattern generator that generates and outputs a test pattern for testing the semiconductor device and incorporated in the chip; a stay time counting unit that starts counting a first count value that shows a stay time of a program in a first subroutine in synchronism with a predetermined first clock signal, when the pattern generator has output a test pattern that shows that the program shifts to the first subroutine, and outputs return instruction data when the first count value reaches a predetermined first value; a call waiting time counting unit that starts counting a second count value that shows a second subroutine call waiting time in synchronism with a predetermined second clock signal, and outputs call instruction data when the second count value reaches a predetermined second value; and a control unit that controls a program counter value so that the program returns from the first subroutine to a call originating routine, upon receiving the return Instruction data from the stay time counting unit and when the pattern generator has output a test pattern that shows the program returns from the first subroutine to the call originating routine, and controls the program counter value so that the program shifts to the second subroutine, upon receiving the call instruction data from the call waiting time counting unit and also when the pattern generator has output a test pattern that shows that the program shifts to the second subroutine.

The semiconductor testing device according to another aspect of the present invention is incorporated in chip in which a semiconductor device that is a target for test is incorporated. The semiconductor testing device comprises a pattern generator that generates and outputs a test pattern for testing the semiconductor device and incorporated in the chip; a stay time counting unit that starts counting a count value that shows a stay time of a program in a subroutine in synchronism with a predetermined clock signal, when the pattern generator has output a test pattern that shows that the program shifts to a subroutine, and outputs return instruction data when the first count value reaches a predetermined value; and a control unit that controls a program counter value so that the program returns from the subroutine to the call originating routine, upon receiving the return instruction data from the stay time counting unit and when the pattern generator has output a test pattern that shows that the program returns from the subroutine to the call originating routine.

The semiconductor testing device according to another aspect of the present invention is incorporated in chip in which a semiconductor device that is a target for test is incorporated. The semiconductor testing device comprises a pattern generator that generates and outputs a test pattern for testing the semiconductor device and incorporated in the chip; a call waiting time counting unit that starts counting a count value that shows a subroutine call waiting time in synchronism with a predetermined clock signal, when the pattern generator has output a test pattern that shows that the counting is started, and outputs call instruction data when the count value reaches a predetermined value; and a control unit that controls a program counter value so that a program shifts to the subroutine, upon receiving the call instruction data from the call waiting time counting unit and when the pattern generator has output a test pattern that shows the program returns to the subroutine.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 9 explains one example of a test pattern applied to the sequence control circuit shown in FIG. 2;

DETAILED DESCRIPTION

Exemplary embodiments of the semiconductor testing device according to the present invention will be explained in detail below with reference to the accompanying drawings. The application of the present invention to a testing of a dynamic RAM will be mainly explained in the embodiments.

Figure 1:
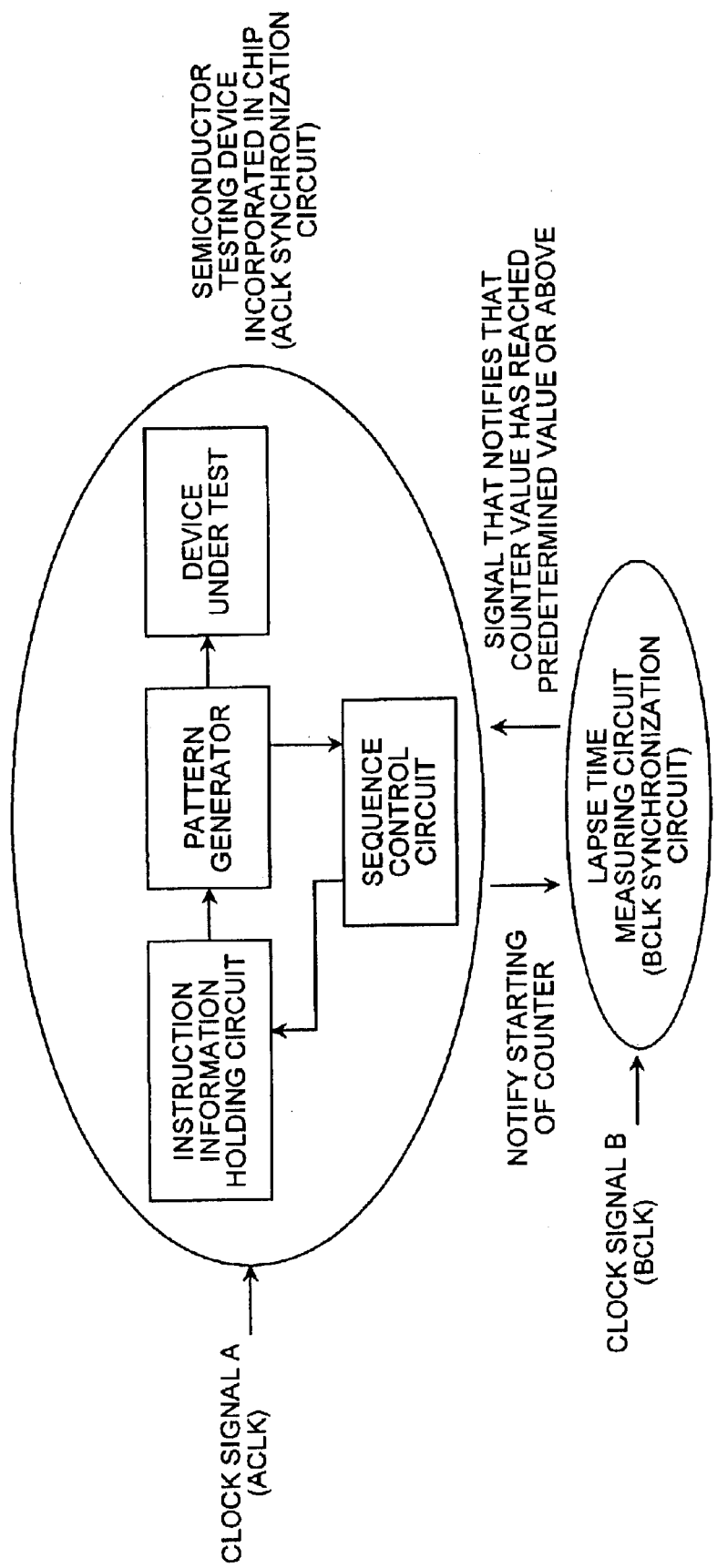
FIG. 1 shows the concept of generating a test pattern by a semiconductor testing device according to an embodiment of the present invention.

The concept of a test pattern generation by the semiconductor testing device according to the present embodiment will be explained first. FIG. 1 shows the concept of generating the test pattern by the semiconductor testing device according to the embodiment of the present invention. As shown in FIG. 1, the semiconductor testing device includes an algorithmic pattern generator. This algorithmic pattern generator includes an instruction information holding circuit that stores and holds an instruction as a test pattern program, a pattern generator that executes the instruction by each one row and tests and measures parameters of a device under test, a sequence control circuit that controls a value of a program counter (PC) that stores the instruction, and a lapse time measuring circuit that measures a subroutine stay time and a subroutine call waiting time in synchronism with a clock signal B, and notifies the measured result.

The sequence control circuit holds a value of a program counter of a jump instruction of a main routine, in a register or the like when the program jumps to the subroutine. When the program returns from the subroutine to the main routine, the sequence control circuit adds a predetermined value to the program counter held in the register, thereby to set a predetermined address of the main routine. The lapse time measuring circuit measures a stay time in the subroutine, and when the stay time reaches a predetermined value or above, the program returns from the subroutine to the main routine. When the subroutine is, for example, a sequence of a disturbance test or a pause test that is memory holding time test of the dynamic RAM, an additional lapse time measuring circuit is provided. This additional lapse time measuring circuit measures a time from when the subroutine is called till when the auto refresh is carried out. When the measured time reaches a predetermined time or above, the lapse time measuring circuit calls the subroutine to carry out the auto refresh. With this arrangement, it is possible to automatically carry out the auto refresh at every predetermined time interval.

As a result, by making the test pattern repetitively used as the subroutine, it is possible to substantially shorten the time of accumulating the program in the instruction information holding circuit. This can facilitate the preparation of the test pattern and the changing of the test specification in a short time.

As shown in FIG. 1, the lapse time measuring circuit operates in synchronism with a clock signal B that is different from a clock signal A to be used for the pattern generation. Therefore, it is possible to independently change the device operation cycle, the device test time, and the auto refresh time interval respectively. As a result, it becomes easy to prepare the test pattern, change the test specification, and analyze the device in a short time.

According to the present invention, as it is possible to prepare the test pattern having the repetition of the same processing as the subroutine, it is possible to operate the lapse time measuring circuit based on the clock signal of the system different from the clock signal used for the pattern generator. Therefore, it becomes possible to carry out the auto refresh and independently change the device operation cycle and the device test time respectively. As a result, it becomes easy to prepare the test pattern, change the test specification, and analyze the device in a short time.

Figure 2:
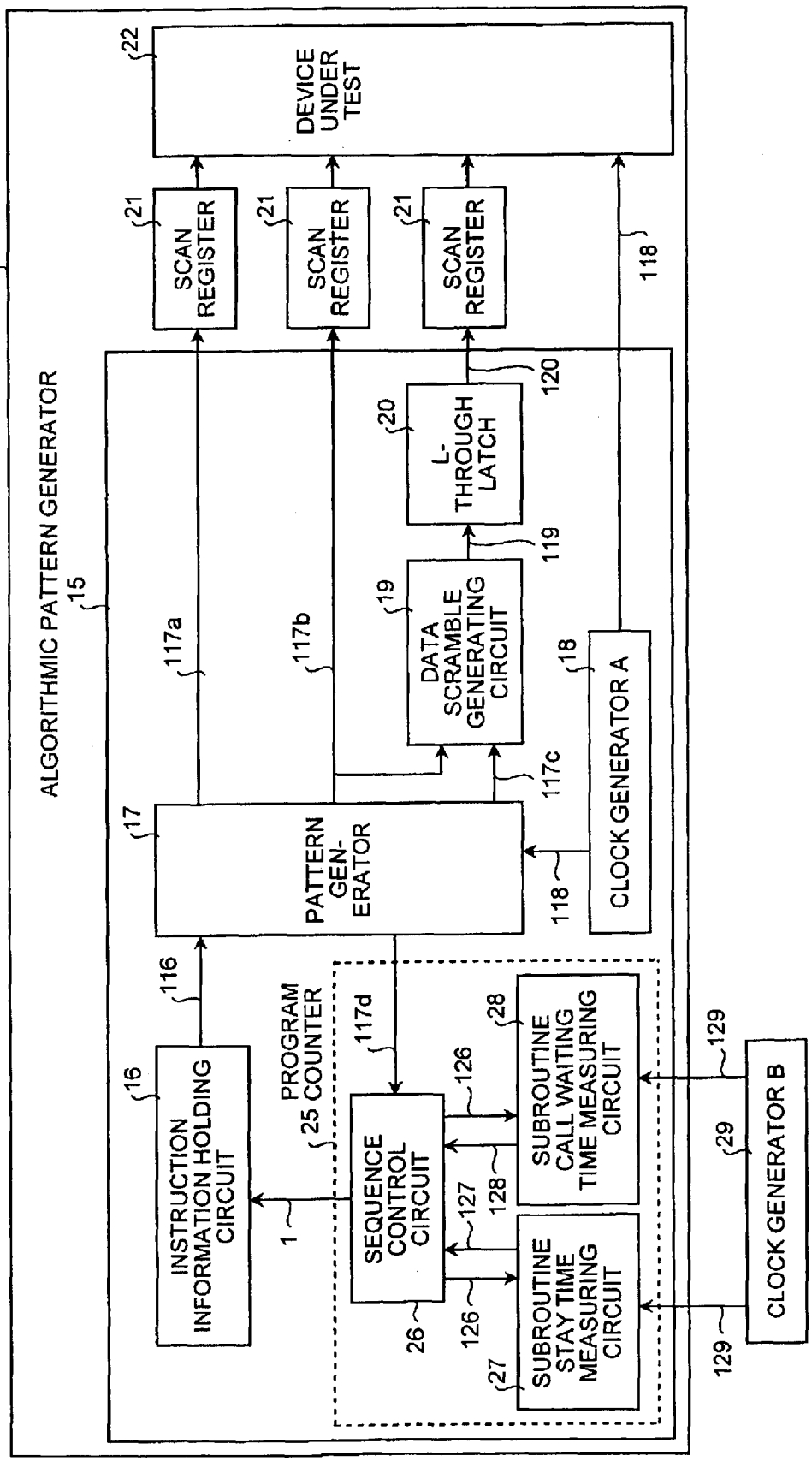
FIG. 2 is a functional block diagram that explains a system basic structure of the semiconductor testing device according to the present embodiment.

The basic structure of the semiconductor testing device according to the present embodiment will be explained. FIG. 2 is a functional block diagram that explains the basic structure of the semiconductor testing device according to the present embodiment. The semiconductor testing device has an algorithmic pattern generator 15 and a device under test 22 mounted on one semiconductor chip 10. The algorithmic pattern generator 15 and the device under test 22 are connected via a scan register 21.

The algorithmic pattern generator 15 includes an instruction information holding circuit 16 that stores and holds a test pattern program, a pattern generator 17 that generates a test pattern based on an instruction, a clock generator A 18 that generates a clock signal 118, and a program counter 25 that controls the order of instruction.

The pattern generator 17 consists of a decoder (not shown) that decodes a macro instruction, a controller (not shown) that controls a pattern generation, an address pattern generator that generates an address signal, a data pattern generator (not shown) that generates memory contents, and a signal controller (not shown) that generates a control signal of operation modes (writing, reading, and the like) of the device under test. With such structure, the pattern generator 17 tests and measures the parameters of the device under test 22.

The clock generator A 18 generates a test period, and rise/fall timings of a clock pulse. The clock generator A 18 supplies the clock signal 118 to the pattern generator 17 and the device under test 22 respectively.

The program counter 25 generates a PC value signal 1. The PC value signal 1 is a signal that determines which one of the instructions stored and held in the instruction information holding circuit 16 is to be output.

The instruction information holding circuit 16 is a memory such as a register, an SRAM (Static Random Access Memory), a flash memory, or a ROM (Read Only Memory). The instruction information holding circuit 16 outputs to the pattern generator 17 an instruction signal 116 assigned by the PC value signal 1.

Following the instruction signal 116 received from the instruction information holding circuit 16, the pattern generator 17 outputs a control signal 117a, an address signal 117b, a scramble type signal and a pre-data signal 117c. More specifically, the pattern generator 17 inputs the control signal 117a and the address signal 117b to the device under test 22 via the scan register 21. The pattern generator 17 inputs the address signal 117b and the scramble type signal and the pre-data signal 117c to a data scramble generating circuit 19.

The data scramble generating circuit 19 receives the address signal 117b, the scramble type signal and the pre-data signal 117c, and outputs a data scramble output data signal 119. An L through-latch 20 latches the data scramble output data signal 119 and inputs result signal, i.e., a data signal 120, to the scan register 21. The scan register 21 outputs the data signal 120 to the device under test 22.

A comparator (not shown) compares the output pattern of the device under test 22 with an expectation pattern output generated by the pattern generator 17. Based on this result, it is decided whether the device under test 22 is functioning properly.

The characteristic feature of the semiconductor testing device, in comparison with the conventional semiconductor testing device, is in the provision of the program counter 25. The program counter 25 of the present invention includes a sequence control circuit 26, a subroutine stay time measuring circuit 27, and a subroutine call waiting time measuring circuit 28. The subroutine stay time measuring circuit 27 and the subroutine call waiting time measuring circuit 28 operate in synchronism with a clock signal 129 of a clock generator B 29.

The sequence control circuit 26 is a logic circuit that controls the program counter of the test pattern program stored in the instruction information holding circuit 16, based on the control signal and the address in the pattern generator 17. The sequence control circuit 26 receives a control signal relating to a jump instruction and a subroutine call instruction, and a program counter control signal 117d of a jump destination address, based on the test pattern generated from the pattern generator 17.

The subroutine stay time measuring circuit 27 is a time measuring circuit that receives from the sequence control circuit 26 a signal 126 that notifies that the sequence control circuit 26 has called a subroutine, and outputs to the sequence control circuit 26 a signal 127 that notifies that the program returns to the subroutine when the count value reaches a predetermined value or above.

The subroutine call waiting time measuring circuit 28 is a time measuring circuit that starts counting upon reception of the signal 126 that notifies the call of the subroutine, and when the count value reaches a predetermined value or above, outputs to the sequence control circuit 26 a signal 128 that notifies a call of other subroutine.

The clock generator B 29 generates a clock signal for driving the subroutine stay time measuring circuit 27 and the subroutine call waiting time measuring circuit 28. The clock generator B 29 is for a system different from that of the clock generator A 18.

Figure 3:
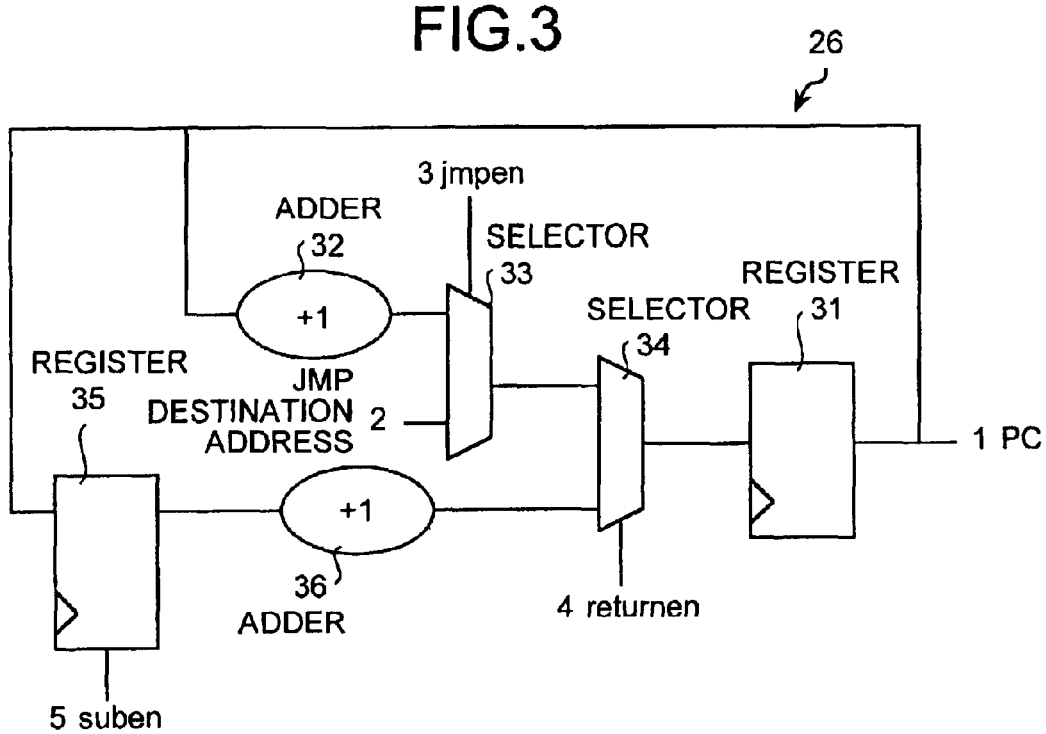
FIG. 3 is a functional block diagram that explains one example of a sequence control circuit shown in FIG. 2.

The basic structure of the sequence control circuit 26 according to the present embodiment will be explained. FIG. 3 is a functional block diagram that explains one example of the basic structure of the sequence control circuit 26 shown in FIG. 2.

In the sequence control circuit 26, a register 31 stores the PC value 1 of the program counter of the instruction to be executed, and stores the PC value of the first program as an initial value at the time of starting the program. An adder 32 adds "1" to the PC value 1 of the register 31. A selector 33 selects an output from the adder 32 and a jump (JMP) destination address 2 based on a jump control signal (jmpen) 3, as the PC value of the program counter that controls the next program instruction. A selector 34 selects an output from the selector 33 and an output from the adder 36 based on a return instruction control signal (returnen) 4, as the PC value of the program counter that controls the next program instruction. The returnen 4 is applied to the selector 34 when the signal 127 for notifying a return from the subroutine output from the subroutine stay time measuring circuit 27 and the return instruction from the pattern generator 17 are satisfied at the same time.

When the instruction stored in the program counter is a jump instruction to the subroutine, a register 35 stores the PC value 1 of the program counter based on a jump instruction control signal (suben) 5 to the subroutine, and stores the value as it is. An adder 36 adds "1" to the output of the register 35. The suben 5 is a control signal applied to a sequence control circuit 26 based on a subroutine call instruction from the pattern generator 17.

One example of the test pattern to be applied to the sequence control circuit 26 shown in FIG. 3 will be explained next. FIG. 9 explains one example of the test pattern applied to the sequence control circuit shown in FIG. 2.

The register 31 stores the PC value "0" of the main routine as an initial value. The adder 32 adds "1" to this initial value to obtain the value "1", and the register 31 stores this value "1", as the next PC value of the program counter. At the next step, the subroutine call instruction of "GO TO SUB1" of the PC "1" is executed. Upon execution of this instruction, the address SUB1 and a jump instruction control signal (jmpen) 3 are applied to the JMP destination address 2 of the sequence control circuit 26. Therefore, the register 31 stores a PC value "20" at the next step, and the program jumps to the instruction of the PC value "20". At this time, the register 35 also stores and holds the PC value "1" of the last step. Further, when a series of instructions of the subroutine SUB1 are executed and the PC value becomes the return instruction in the PC value "23", then the adder 36 adds "1" to the PC value "1" stored in the register 35 to obtain the value "2". The register 31 stores this value via the selector 34 based on the return instruction control signal (returnen) 4. At the next step, the instruction of the PC value "2" of the main routine is executed. Thereafter, the program is executed at each step up to the PC value "6". As a result, the program is executed in the order of 0 to 1 to 20 to 21 to 22 to 23 to 2 to 3 to 4 to 5 to 6.

According to the present invention, it is possible to prepare a test pattern that has the repetition of the same processing as a subroutine. Therefore, it becomes easy to prepare the test pattern in a short time.

Figure 10:
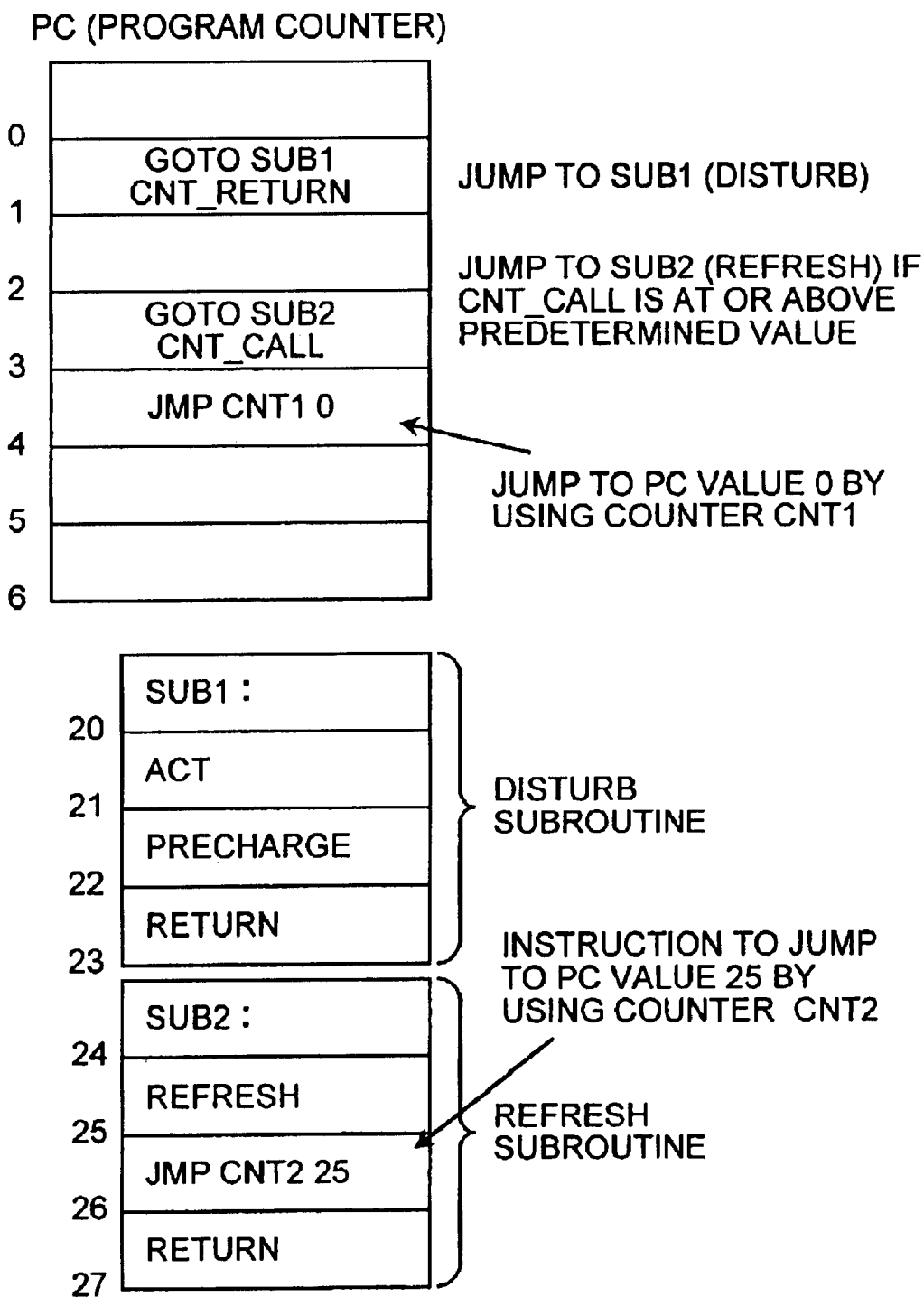
FIG. 10 explains one example of a test pattern using an auto refresh function and a disturb time determination function of a dynamic RAM shown in FIG. 2.

A test pattern when the auto refresh function and the disturb time determination function of the dynamic RAM are used by using the semiconductor testing device shown in FIG. 2 will be explained. FIG. 10 explains one example of the test pattern using the auto refresh function and the disturb time determination function of the dynamic RAM shown in FIG. 2.

A volatile memory such as a dynamic RAM requires a data rewriting (refresh) operation at every constant time period, in order to avoid the loss of data stored in the memory. The function of executing the refresh operation at every constant time in the dynamic RAM is called the auto refresh.

The disturbance test is a test that, after writing data in a predetermined cell of the dynamic RAM, incessant access is made to an adjacent cell or an adjacent word line to disturb the predetermined cell, and the data is read thereby to confirm whether the dynamic RAM is operating normally. The test time of repeating the reading by making access to the word line after writing is called the disturb time. The dynamic RAM requires the auto refresh at a predetermined time interval while carrying out the disturbance test.

The test pattern shown in FIG. 10 is applied to the sequence control circuit 26 shown in FIG. 3. The register 31 shown in FIG. 3 stores the PC value "0" of the main routine shown in FIG. 10 as the initial value. The adder 32 adds "1" to this initial value, and therefore the register 31 stores the "1" via the selectors 33 and 34. At the next step, the instruction "GO TO SUB1_CNT_CALL" of the PC value "1" is executed. When this instruction is executed, the program jumps to the disturb subroutine of the PC value "20". The register 35 stores and holds the PC value "1" at the same time. The instructions from the PC value "20" to the PC value "23" of the disturb subroutine are executed by a predetermined number of times, that is, by the CNT_RETURN. Then, the value "1" is added to the PC value "1" stored in the register 35 based on the return instruction, thereby to obtain the PC value "2". The register 31 stores the value "2" via the selector 34 based on the return instruction control signal (returnen) 4. At the next step, the instruction of the PC value "2" of the main routine is executed. When the CNT_RETURN is 3, the program is executed in the order of 0 to 1 to 20 to 21 to 22 to 23 to 20 to 21 to 22 to 23 to 20 to 21 to 22 to 23 to 2.

The program proceeds to the instruction of the PC value "3" to execute the instruction "GO TO SUB2 CNT_CALL". This is the instruction for the program to jump to the subroutine of refresh at the address SUB2 when the CNT_CALL is at or above a predetermined value. In other words, this is the instruction to carry out the automatic refresh during the disturbance test. When the CNT_CALL is less than the predetermined value, the program proceeds to execute the instruction of the next PC value "4". Assume that the CNT_CALL is not higher than the predetermined value, and the program proceeds to execute the instruction "JMP CNT1 0" of the next PC value "4". Then, the program jumps to the instruction of the PC value "0" based on the value of the counter CNT1, and jumps to the disturb subroutine again based on the instruction of the PC value "1" and returns to the instruction of the PC value "2 again. When the CNT_RETURN is 3, the program is executed in the order of 3 to 4 to 0 to 1 to 20 to 21 to 22 to 23 to 20 to 21 to 22 to 23 to 20 to 21 to 22 to 23 to 2.

The program proceeds to the instruction "GO TO SUB2 CNT_CALL" of the PC value "3". When the counter value CNT_CALL is at or above the predetermined value, the program jumps to the refresh subroutine at the address SUB2. The register 35 stores and holds the PC value "3". After the instructions from the PC value "24" to the PC value "27" of the refresh subroutine are executed, 1 is added to the PC value "3" stored in the register 35 based on the return instruction, and the program returns to the instruction of the PC value "4". As the instruction of the PC value "4" is "JMP CNT1 0", depending on the value of the counter CNT1, the program once returns to the instruction of the PC value "0" and repeats the disturbance test from the beginning. As a result, the program is executed in the order of 3 to 24 to 25 to 26 to 27 to 4 to 0.

Figure 11:
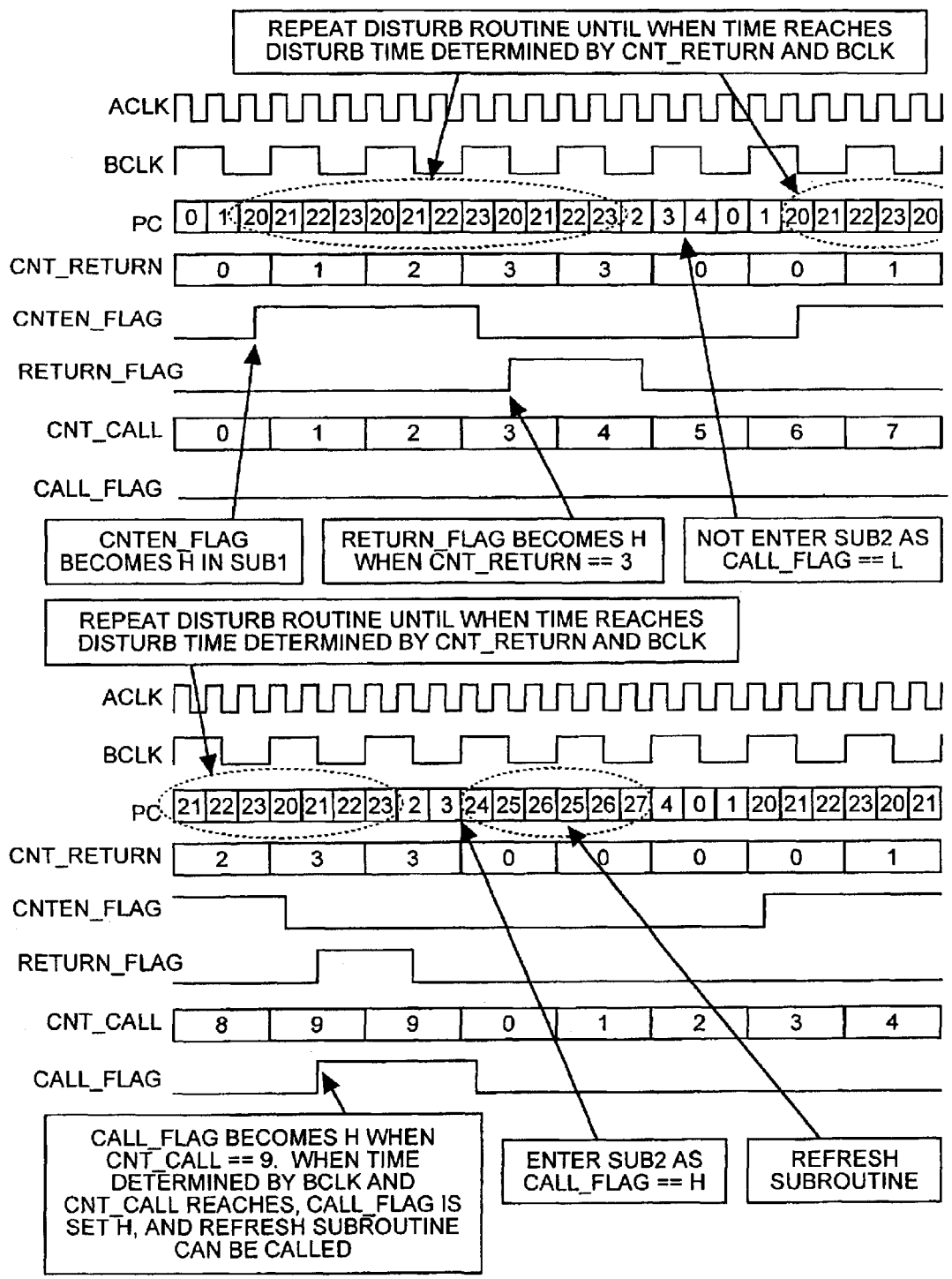
FIG. 11 explains one example of the application of a subroutine stay time measuring circuit and a subroutine call waiting time measuring circuit shown in FIG. 2.

An example of the application of the subroutine stay time measuring circuit 27 and the subroutine call waiting time measuring circuit 28 shown in FIG. 2 will be explained. FIG. 11 explains one example of the application of the subroutine stay time measuring circuit and the subroutine call waiting time measuring circuit shown in FIG. 2. In this example, it is assumed that the CNT_RETURN is 3, and the CNT_CALL is 9.

As shown in FIG. 11, ACLK denotes a synchronization signal of the clock generator A18 shown in FIG. 2, and BCLK denotes a synchronization signal of the clock generator B 29. PC denotes a program counter value. As explained above, it is assumed that the CNT_RETURN is 3 and the CNT_CALL is 9 in the test pattern shown in FIG. 10.

The subroutine stay time measuring circuit 27 shown in FIG. 2 measures a lapse time when the program jumps from the PC value 1 of the program counter to the disturb subroutine SUBI shown in FIG. 10. The program repeats the disturb subroutine until when the disturb time determined by the time period of the CNT_RETURN and the BCLK reaches. When the disturb time is exceeded, the program goes out from the disturb subroutine SUB1 and returns to the main routine. When the CNT_RETURN in FIG. 11 enters the disturb subroutine SUB1, the count value increases from 1 to 3 according to the cycle of the disturbance test. When the program goes out from the disturb subroutine SUB1, the count value is cleared to zero.

In other words, the CNTEN_FLAG becomes high (H), when the program execution enters the disturb subroutine SUB1. Upon receiving this signal, the subroutine stay time measuring circuit 27 starts counting time. When the CNT_RETURN becomes 3, that is, when the measuring time reaches the disturb time, the RETURN_FLAG becomes high (H). When the subroutine stay time measuring circuit 27 receives this signal, the program execution goes out from the disturb subroutine SUB1, and returns to the main routine.

On the other hand, the subroutine call waiting time measuring circuit 28 shown in FIG. 2 starts counting, when the program execution enters the disturb subroutine SUB1 and the CNTEN_FLAG changes to H. When the time determined by the CNT_CALL and the BCKL reaches, the CALL_FLAG becomes H. When the subroutine call waiting time measuring circuit 28 receives this signal, the program execution jumps to the refresh subroutine SUB2 shown in FIG. 10. The program executes the refresh of the memory and returns to the main routine. The count value of the CNT_CALL in FIG. 11 increases until when the program jumps to the refresh subroutine SUB2, and the count value is cleared to zero once in the refresh subroutine SUB2.

As explained above, the semiconductor testing device comprises the sequence control circuit 26, and the subroutine stay time measuring circuit 27 and the subroutine call waiting time measuring circuit 28 that operate in synchronism with the clock signal 129 of the clock generator B 29. Therefore, the semiconductor testing device can easily control the stay time in the disturb subroutine and the time of calling the refresh subroutine. As a result, it is possible to carry out the auto refresh while carrying out the disturbance test.

The semiconductor testing device incorporated in chip uses the subroutine stay time measuring circuit 27 and the subroutine call waiting time measuring circuit 28 that operate in synchronism with the clock signal 129 of the clock generator B 29 that is different from the clock signal used for the pattern generation. Therefore, the semiconductor testing device can independently change the device operation cycle, the device disturb time, and the auto refresh time interval respectively. As a result, it becomes easy to prepare the test pattern, change the test specification, and analyze the device in a short time.

According to the present invention, as it is possible to prepare the test pattern having the repetition of the same processing as the subroutine, it is possible to operate the subroutine stay time measuring circuit and the subroutine call waiting time measuring circuit based on the clock signal of the system different from the clock signal used for the pattern generator. Therefore, it becomes possible to carry out the auto refresh, and change the device operation cycle and the device test time independently. As a result, it becomes easy to prepare the test pattern, change the test specification, and analyze the device in a short time.

Figure 4:
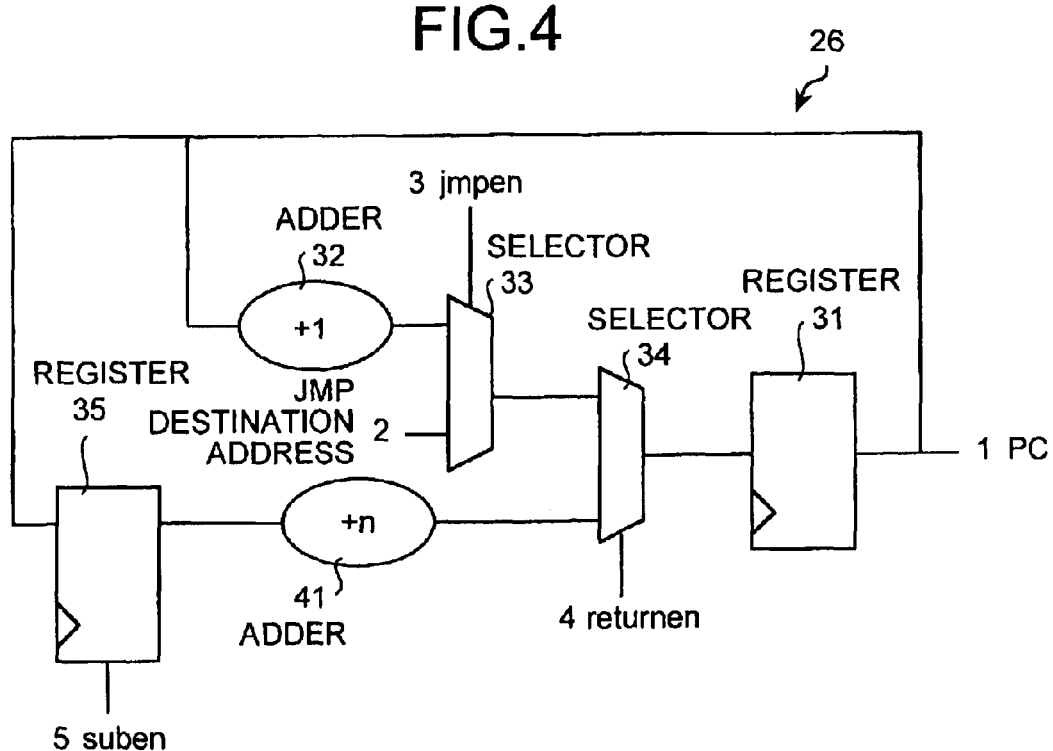
FIG. 4 is a functional block diagram that explains another example of the sequence control circuit shown in FIG. 2.

In the sequence control circuit 26 of the semiconductor testing device according to the present embodiment, the address of the program that returns from the subroutine to the main routine is the address PC+1 that is obtained by adding "1" to the PC value held in the register 35. However, the present embodiment is not limited to this, and it is also possible that the program returns to an optional address PC+n. FIG. 4 is a functional block diagram that explains another example of the sequence control circuit 26 shown in FIG. 2. In the sequence control circuit shown in FIG. 4, the return address value is optional. In FIG. 4, an adder 41 adds an optional value "n" to the PC value of the register 35. After the program goes out from the subroutine based on the return instruction, the program can return to the address PC+n of the main routine.

According to the present invention, it is possible to prepare the test pattern having the repetition of the same processing as the subroutine, and the program can return to a predetermined instruction of the main routine after executing the subroutine. As a result, it becomes easy to prepare the test pattern and change the test specification in a short time.

Figure 5:
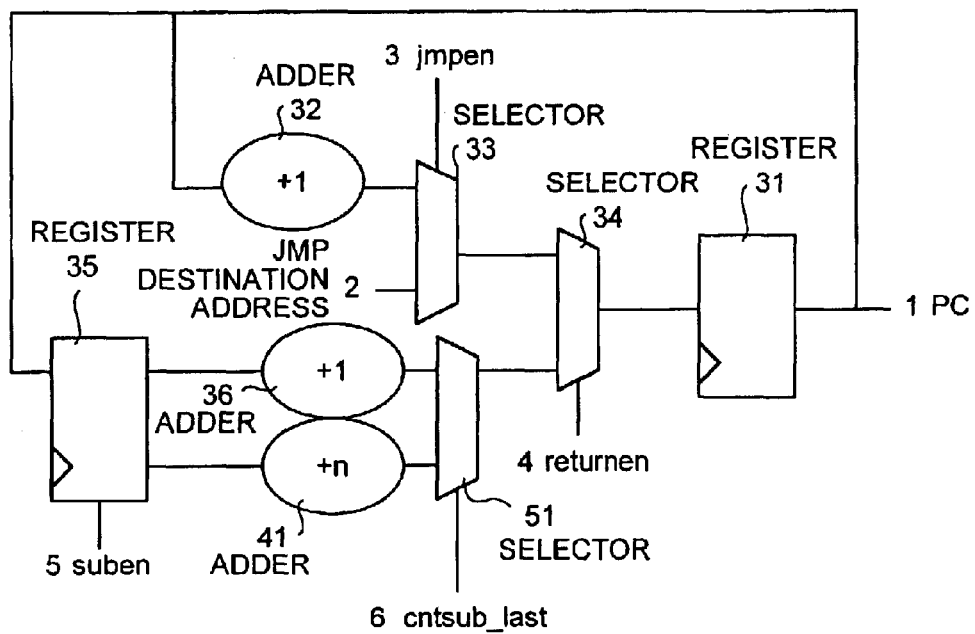
FIG. 5 is a functional block diagram that explains still another example of the sequence control circuit shown in FIG. 2.

The pattern generator 17 may have a counter CNTSUB that counts the repetition of the subroutine, whereby the program returns to the instruction of the counter value PC+n only when the CNTSUB is in the last loop, and returns to the counter value PC+1 in other cases. FIG. 5 is a functional block diagram that explains still another example of the sequence control circuit 26 shown in FIG. 2. A selector 51 controlled based on a counter signal (cntsub_last) 6 as the count of the repetition of the subroutine selects whether "1" is to be added or "n" is to be added to the PC value held in a register 35. In this sequence control circuit, the program returns to the instruction of the PC+n only when the CNTSUB is in the last loop, and returns to the PC+1 in other cases.

According to the present invention, it is possible to prepare the test pattern having the repetition of the same processing as the subroutine, and the program can return to a predetermined instruction of the main routine at the final repetition time of the subroutine. As a result, it becomes easy to prepare the test pattern and change the test specification in a short time.

Figure 6:
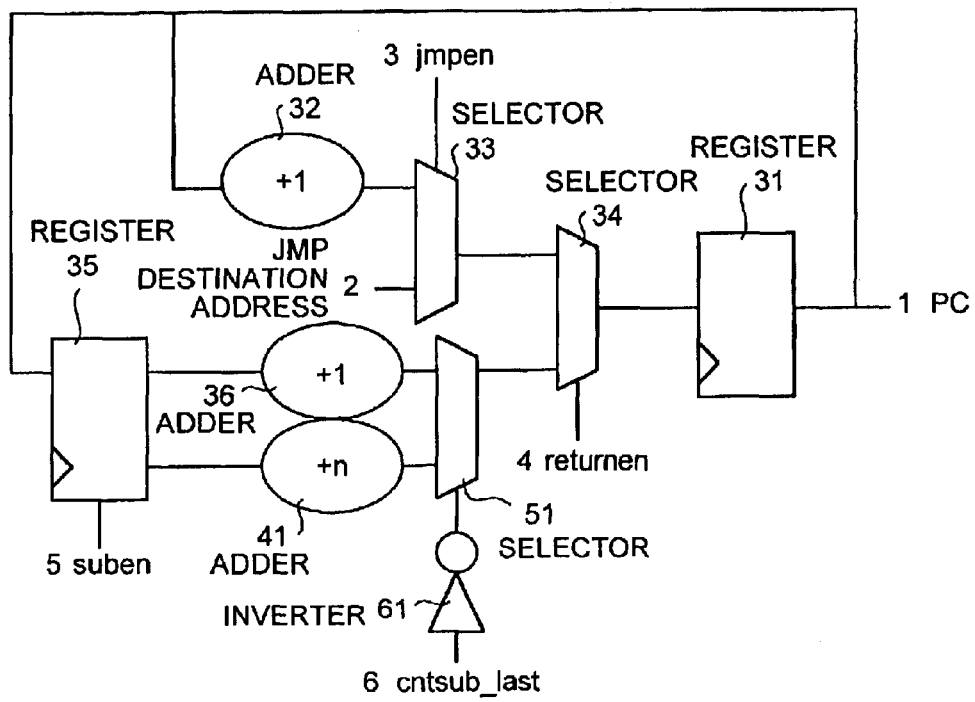
FIG. 6 is a functional block diagram that explains still another example of the sequence control circuit shown in FIG. 2.

The pattern generator 17 may have a counter CNTSUB that counts the repetition of the subroutine, whereby the program returns to the instruction of the counter value PC+1 only when the CNTSUB is in the last loop, and returns to the counter value PC+n in other cases. FIG. 6 is a functional block diagram that explains still another example of the sequence control circuit 26 shown in FIG. 2. A counter signal (cntsub_last) 6 of the counter that counts the repetition of the subroutine to control the selector 51 is input via an inverter 61. Based on this, the program returns to the instruction of the PC+1 only when the CNTSUB is in the last loop, and returns to the PC+n in other cases.

According to the present invention, it is possible to prepare the test pattern having the repetition of the same processing as the subroutine, and the program can return to a predetermined instruction of the main routine at other than the final repetition time of the subroutine. As a result, it becomes easy to prepare the test pattern and change the test specification in a short time.

Figure 7:
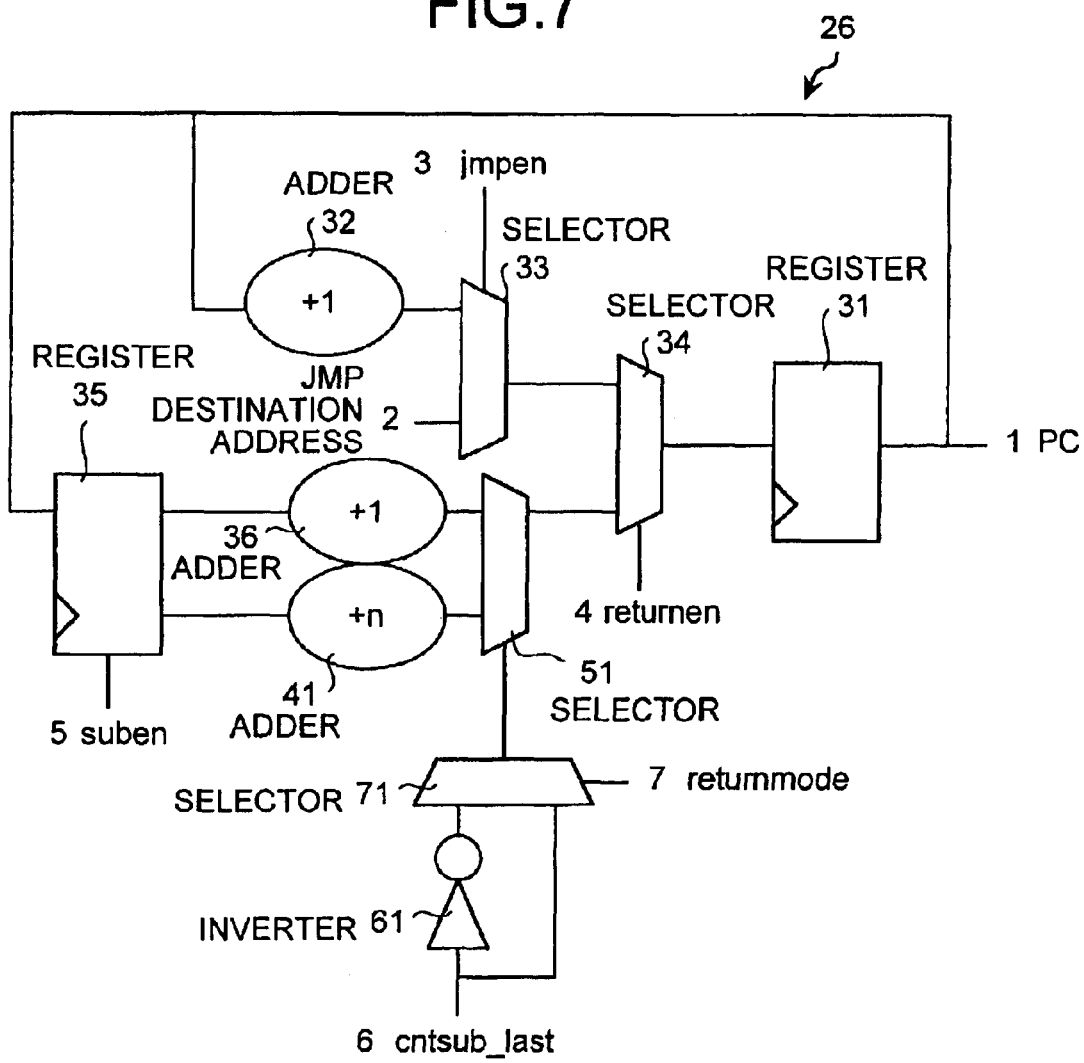
FIG. 7 is a functional block diagram that explains still another example of the sequence control circuit shown in FIG. 2.

FIG. 7 is a functional block diagram that explains still another example of the sequence control circuit 26 shown in FIG. 2. The counter signal (cntsub_last) 6 of the counter that counts the repetition of the subroutine is divided into a signal that passes through the inverter 61 and a signal that does not pass through the inverter 61. A logic circuit selected by a selector 71 is added to the selector 51. Based on this arrangement, it is possible to select the functions of the sequence control circuit according to the above two examples. The selector 71 is controlled based on a return mode control signal (returnmode) 7.

According to the present invention, it is possible to prepare the test pattern having the repetition of the same processing as the subroutine. It is possible to select whether the program returns to a predetermined instruction of the main routine at the final repetition time of the subroutine or the program returns to a predetermined instruction of the main routine at other than the final repetition time of the subroutine. As a result, it becomes easy to prepare the test pattern and change the test specification in a short time.

Figure 8:
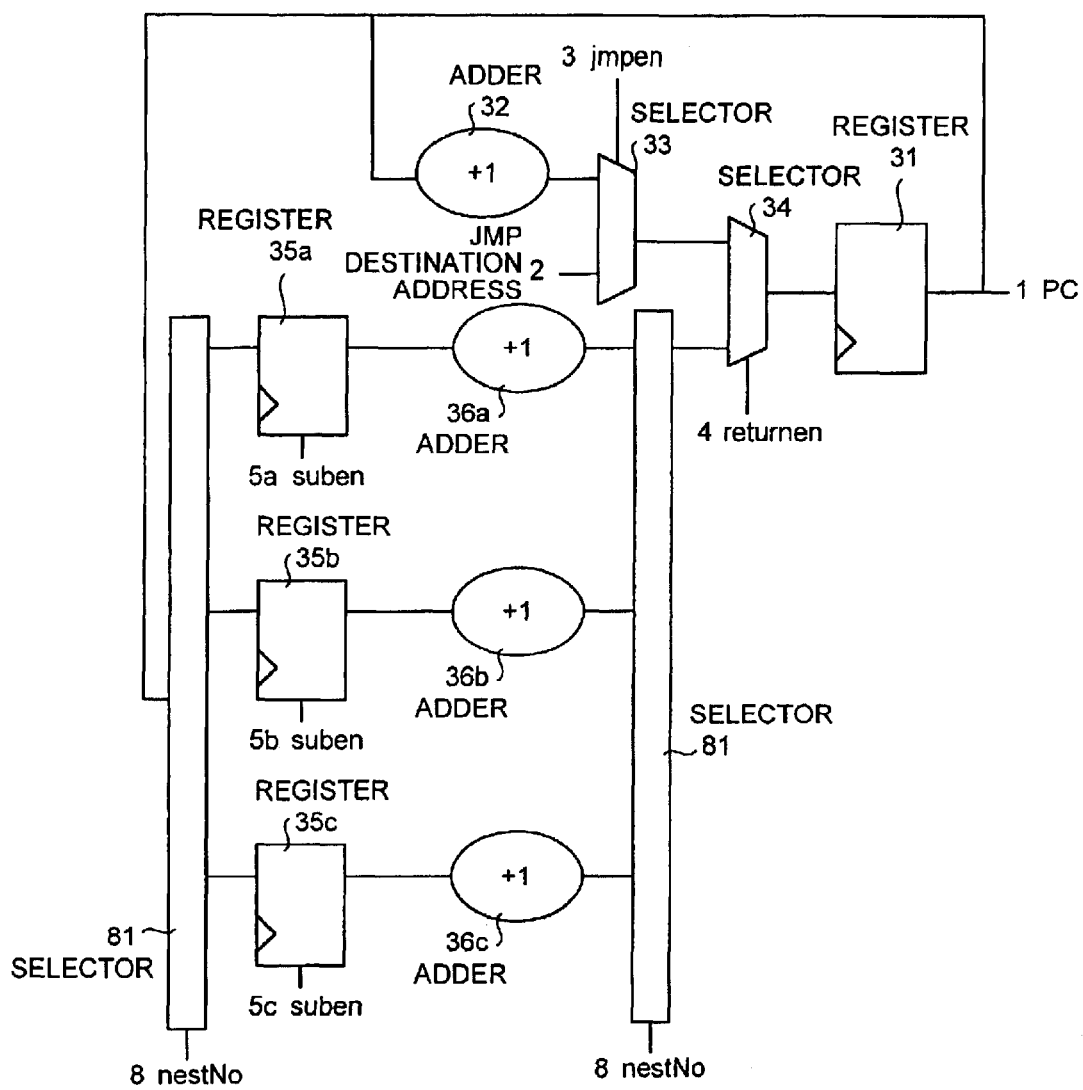
FIG. 8 is a functional block diagram that explains still another example of the sequence control circuit shown in FIG. 2.

FIG. 8 is a functional block diagram that explains still another example of the sequence control circuit shown in FIG. 2. The sequence control circuit has a plurality of registers 35a, 35b, and 35c, adders 36a, 36b, and 36c, and a selector 81 so as to be able to call a subroutine from a main routine, and call other subroutine from this subroutine, what is called nesting. The registers 35a, 35b, and 35c store a PC value immediately before jumping to a subroutine respectively. Each of the adders 36a, 36b, and 36c adds "1" to the PC value held in each of the registers 35a, 35b, and 35c. The selector 81 is controlled based on a nesting control signal (nesNo) 8. The value "1" is added to the nesNo 8 when the subroutine is called, and "1" is subtracted from this signal when the program returns from the subroutine based on a return instruction. The selector 81 selects a corresponding one of the registers 35*a*, 35*b,* and 35*c*.

According to the present invention, it is possible to prepare the test pattern having the repetition of the same processing as the subroutine. After a second subroutine is called from a first subroutine, the program can further return from the second subroutine to the first subroutine. As a result, it becomes easy to prepare the test pattern and change the test specification in a short time.

While the present embodiment assumes that the subroutine stay time measuring circuit 27 and the subroutine call waiting time measuring circuit 28 output the return instruction data and the call instruction data as fixed predetermined values respectively, it is also possible to change the predetermined values in response to the instructions from the pattern generator 17.

According to the present invention, it is possible to prepare the test pattern having the repetition of the same processing as the subroutine. It is easy to change the subroutine stay time and the subroutine call time, by changing the subroutine stay time counter value and subroutine call waiting time counter value. Therefore, it becomes possible to carry out the auto refresh, and change the device operation cycle and the device test time independently. As a result, it becomes easy to prepare the test pattern, change the test specification, and analyze the device in a short time.

In the present embodiment, while the subroutine call waiting time measuring circuit 28 starts counting when the program execution enters the disturb subroutine, the count start timing is not limited to this, and this timing may be at the header of the test pattern.

In the present embodiment, while the subroutine stay time measuring circuit 27 and the subroutine call waiting time measuring circuit 28 receive the synchronization signal from the same clock generator B 29, these circuits may receive synchronization signals from clock generators of different systems.

As explained above, according to the present invention, it becomes easy to prepare the test pattern, change the test specification, and analyze the device in a short time.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor testing device that is incorporated in chip in which a semiconductor device that is a target for test is incorporated, comprising:

a pattern generator that generates and outputs a test pattern for testing the semiconductor device and incorporated in the chip;

a stay time counting unit that starts counting a first count value that shows a stay time of a program in a first subroutine in synchronism with a predetermined first clock signal, when the pattern generator has output a test pattern that shows that the program shifts to the first subroutine, and outputs return instruction data when the first count value reaches a predetermined first value;

a call waiting time counting unit that starts counting a second count value that shows a second subroutine call waiting time in synchronism with a predetermined second clock signal, and outputs call instruction data when the second count value reaches a predetermined second value; and a control unit that controls a program counter value so that the program returns from the first subroutine to a call originating routine, upon receiving the return instruction data from the stay time counting unit and when the pattern generator has output a test pattern that shows the program returns from the first subroutine to the call originating routine, and controls the program counter value so that the program shifts to the second subroutine, upon receiving the call instruction data from the call waiting time counting unit and also when the pattern generator has output a test pattern that shows that the program shifts to the second subroutine.

2. The semiconductor testing device according to claim 1, wherein the call waiting time counting unit starts counting a count value that shows a second subroutine call waiting time in synchronism with a predetermined clock signal, when the pattern generator has output a test pattern that shows that the program shifts to the first subroutine.

3. The semiconductor testing device according to claim 1, wherein any one of the stay time counting unit and the call waiting time counting unit changes the first value and the second value respectively in response to an instruction from the pattern generator.

4. The semiconductor testing device according to claim 1, wherein the control unit comprises a holding unit that holds a program counter value of a call originating routine when the pattern generator has output a test pattern that shows that the program returns to a subroutine, and when the count value of the stay time counting unit reaches a predetermined value and when the pattern generator has output a test pattern that shows that the program returns from the subroutine to the call originating routine, the control unit adds a predetermined value to the program counter value held in the holding unit, and sets the added result as the next program counter value.

5. The semiconductor testing device according to claim 4, wherein the predetermined value added to the program counter value held in the holding unit is one.

6. The semiconductor testing device according to claim 4, wherein the control unit further comprises an execution number counting unit that counts the number of repetitively executing the subroutine, and at the last repeating time of the subroutine, the control unit adds a predetermined value to the program counter value held in the holding unit, and sets the added result as the next program counter value.

7. The semiconductor testing device according to claim 4, wherein the control unit further comprises an execution number counting unit that counts the number of repetitively executing the subroutine, and at times other than the last repeating time of the subroutine, the control unit adds a predetermined value to the program counter value held in the holding unit, and sets the added result as the next program counter value.

8. The semiconductor testing device according to claim 6, further comprising:

a selecting unit that selects whether at the last repeating time of the subroutine, the control unit adds a predetermined value to the program counter value held in the holding unit, and sets the added result as the next program counter value, or at times other than the last repeating time of the subroutine, the control unit adds a predetermined value to the program counter value held in the holding unit, and sets the added result as the next program counter value.

9. The semiconductor testing device according to claim 7, further comprising:

a selecting unit that selects whether at the last repeating time of the subroutine, the control unit adds a predetermined value to the program counter value held in the holding unit, and sets the added result as the next program counter value, or at times other than the last repeating time of the subroutine, the control unit adds a predetermined value to the program counter value held in the holding unit, and sets the added result as the next program counter value.

10. The semiconductor testing device according to claim 4, wherein the control unit further comprises a plurality of holding units that hold program counter values for a program to return from the second subroutine to the first subroutine, at the time of calling the second subroutine from the first subroutine.

11. A semiconductor testing device that is incorporated in chip in which a semiconductor device that is a target for test is incorporated, comprising:

a pattern generator that generates and outputs a test pattern for testing the semiconductor device and incorporated in the chip;

a stay time counting unit that starts counting a count value that shows a stay time of a program in a subroutine in synchronism with a predetermined clock signal, when the pattern generator has output a test pattern that shows that the program shifts to a subroutine, and outputs return instruction data when the first count value reaches a predetermined value; and a control unit that controls a program counter value so that the program returns from the subroutine to the call originating routine, upon receiving the return instruction data from the stay time counting unit and when the pattern generator has output a test pattern that shows that the program returns from the subroutine to the call originating routine.

12. The semiconductor testing device according to claim 11, wherein the stay time counting unit changes the predetermined value in response to an instruction from the pattern generator.

13. The semiconductor testing device according to claim 11, wherein the control unit comprises a holding unit that holds a program counter value of a call originating routine when the pattern generator has output a test pattern that shows that the program returns to a subroutine, and when the count value of the stay time counting unit reaches a predetermined value and when the pattern generator has output a test pattern that shows that the program returns from the subroutine to the call originating routine, the control unit adds a predetermined value to the program counter value held in the holding unit, and sets the added result as the next program counter value.

14. The semiconductor testing device according to claim 13, wherein the predetermined value added to the program counter value held in the holding unit is one.

15. The semiconductor testing device according to claim 13, wherein the control unit further comprises an execution number counting unit that counts the number of repetitively executing the subroutine, and at the last repeating time of the subroutine, the control unit adds a predetermined value to the program counter value held in the holding unit, and sets the added result as the next program counter value.

16. The semiconductor testing device according to claim 13, wherein the control unit further comprises an execution number counting unit that counts the number of repetitively executing the subroutine, and at times other than the last repeating time of the subroutine, the control unit adds a predetermined value to the program counter value held in the holding unit, and sets the added result as the next program counter value.

17. The semiconductor testing device according to claim 15, further comprising:

a selecting unit that selects whether at the last repeating time of the subroutine, the control unit adds a predetermined value to the program counter value held in the holding unit, and sets the added result as the next program counter value, or at times other than the last repeating time of the subroutine, the control unit adds a predetermined value to the program counter value held in the holding unit, and sets the added result as the next program counter value.

18. The semiconductor testing device according to claim 13, wherein the control unit further comprises a plurality of holding units that hold program counter values for a program to return from the second subroutine to the first subroutine, at the time of calling the second subroutine from the first subroutine.

19. A semiconductor testing device that is incorporated in chip in which a semiconductor device that is a target for test is incorporated, comprising:

a pattern generator that generates and outputs a test pattern for testing the semiconductor device and incorporated in the chip;

a call waiting time counting unit that starts counting a count value that shows a subroutine call waiting time in synchronism with a predetermined clock signal, when the pattern generator has output a test pattern that shows that the counting is started, and outputs call instruction data when the count value reaches a predetermined value; and a control unit that controls a program counter value so that a program shifts to the subroutine, upon receiving the call instruction data from the call waiting time counting unit and when the pattern generator has output a test pattern that shows the program returns to the subroutine.

20. The semiconductor testing device according to claim 19, wherein the call waiting time counting unit changes the predetermined value in response to an instruction from the pattern generator.

* * * * *